(12) United States Patent
Jayaraman et al.

(10) Patent No.: US 11,443,793 B2
(45) Date of Patent: Sep. 13, 2022

(54) BATTERY LIFE BASED ON INHIBITED MEMORY REFRESHES

(71) Applicant: Intel Corporation, Santa Clara, CA (US)

(72) Inventors: Ramkumar Jayaraman, Bangalore (IN); Krishnaprasad H, Bangalore (IN); Kausik Ghosh, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/068,732

(22) Filed: Oct. 12, 2020

(65) Prior Publication Data

US 2021/0043247 A1    Feb. 11, 2021

Related U.S. Application Data

(63) Continuation of application No. 16/458,023, filed on Jun. 29, 2019, now Pat. No. 10,811,076.

(51) Int. Cl.
| | |
|---|---|
| *G11C 11/406* | (2006.01) |
| *G11C 5/04* | (2006.01) |
| *G11C 11/4096* | (2006.01) |
| *G11C 11/4093* | (2006.01) |
| *G06F 1/3225* | (2019.01) |

(Continued)

(52) U.S. Cl.
CPC ...... *G11C 11/40615* (2013.01); *G06F 1/3225* (2013.01); *G06F 1/3275* (2013.01); *G11C 5/04* (2013.01); *G11C 11/4074* (2013.01); *G11C 11/4093* (2013.01); *G11C 11/4096* (2013.01)

(58) Field of Classification Search
CPC . G11C 11/40615; G11C 5/04; G11C 11/4074; G11C 11/4096; G11C 11/4093; G06F 1/3225; G06F 1/3275
USPC ............................................................ 365/222
See application file for complete search history.

(56) References Cited

U.S. PATENT DOCUMENTS 5,943,280 A * 8/1999 Tsukamoto ............ G11C 29/50
                                                      365/222
6,226,709 B1    5/2001 Goodwin et al.
(Continued)

FOREIGN PATENT DOCUMENTS

| JP | 09282872 | 10/1997 |
|---|---|---|
| JP | 2002132591 | 5/2002 |
| WO | 2017205378 | 11/2017 |

OTHER PUBLICATIONS

International Search Report & Written Opinion dated Sep. 3, 2020 for PCT Patent Application No. PCT/US2020/032970.
(Continued)

*Primary Examiner* — Anthan Tran
(74) *Attorney, Agent, or Firm* — Schwabe, Williamson & Wyatt, P.C.

(57) ABSTRACT

Disclosed herein are mechanisms and methods for reducing power consumed by various DRAM technologies (e.g., high-capacity DRAM and/or 3D DRAM) which may impact battery life of the platform. These mechanisms and methods may opportunistically reduce the power consumed by DRAM by inhibiting periodic refresh commands to memory ranks that are not in-use. Since these mechanisms and methods may be based on enhancements to memory controllers, they may accordingly be operating system (OS) agnostic.

18 Claims, 12 Drawing Sheets

(51) Int. Cl.
    *G11C 11/4074*    (2006.01)
    *G06F 1/3234*    (2019.01)

(56) References Cited

U.S. PATENT DOCUMENTS

| | | | | |
|---|---|---|---|---|
| 8,537,006 | B2* | 9/2013 | Flath | G06F 13/409 |
| | | | | 340/540 |
| 9,691,468 | B2 | 6/2017 | Bains | |
| 10,510,396 | B1 | 12/2019 | Notani et al. | |
| 10,811,076 | B1* | 10/2020 | Jayaraman | G11C 11/4093 |
| 2003/0053361 | A1* | 3/2003 | Zhang | G11C 11/40622 |
| | | | | 365/222 |
| 2005/0105357 | A1* | 5/2005 | Oh | G11C 11/406 |
| | | | | 365/222 |
| 2009/0027989 | A1 | 1/2009 | Michalak et al. | |
| 2015/0127899 | A1 | 5/2015 | Cordero et al. | |
| 2015/0254136 | A1* | 9/2015 | Hoya | G06F 11/1012 |
| | | | | 714/764 |
| 2017/0365352 | A1* | 12/2017 | Shin | G06F 12/0246 |

OTHER PUBLICATIONS

Notice of Allowance dated Jun. 11, 2020 for U.S. Appl. No. 16/458,023.

Windows Internals Part 1, Microsoft Press, 6th Ed., chapter 5, p. 455-6. published Mar. 15, 2012.

Liu et al., "RAIDR: Retention-Aware Intelligent DRAM Refresh", ACM SIGARCH Computer Architecture News. V. 40, No. 3, pp. 1-12. Jun. 9, 2012.

\* cited by examiner

BATTERY LIFE BASED ON INHIBITED MEMORY REFRESHES

CLAIM OF PRIORITY

This application is a continuation of, and claims the benefit of priority to U.S. patent application Ser. No. 16/458,023, filed on Jun. 29, 2019, titled "BATTERY LIFE BASED ON INHIBITED MEMORY REFRESHES," and which is incorporated by reference in entirety.

BACKGROUND

Battery-powered and hand-held platforms may power-down many of their circuitries while not in use. An exception to this relates to Dynamic Random Access Memory (DRAM), which may hold a CPU's execution context and thus should not be powered down. DRAM may be either placed in an active state, or put in a low-power data-retaining state known as self-refresh mode.

The power consumed by DRAM for periodically refreshing its storage capacitors is referred to as "refresh power," while the power consumed by DRAM in the active state is referred to as "active power" (which may be the sum of refresh power and read-write power). With high-density DRAM devices such as 64 gigabit (Gb) DRAM chips, as well as with 3D DRAM chips, the refresh power as well as the active power is expected to increase significantly. This may lead to faster battery drainage, reduced battery life, and a desire for bulkier batteries.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
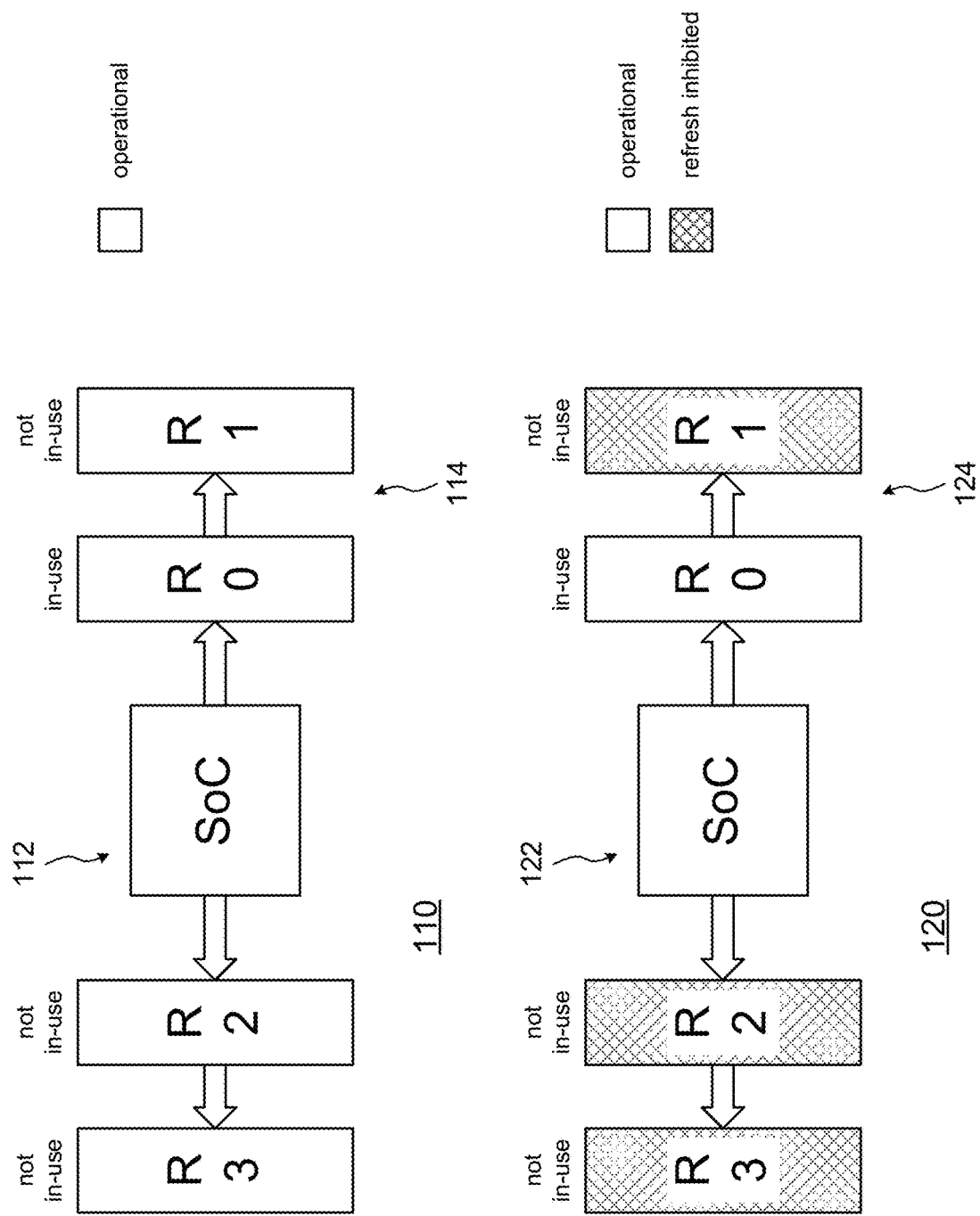
FIG. 1 illustrates power states of a System-on-Chip (SoC) and individual Dual In-line Memory Modules (DIMMs) pertaining to an S0 state (e.g., an operational state), in accordance with some embodiments of the disclosure.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Disclosed herein are mechanisms and methods for reducing power consumed by various DRAM technologies (e.g., high-capacity DRAM and/or 3D DRAM) which may impact battery life of the platform. These mechanisms and methods may opportunistically reduce the power consumed by DRAM by inhibiting periodic refresh commands to memory ranks that are not in-use. Since these mechanisms and methods may be based on enhancements to memory controllers (MCs), they may accordingly be operating system (OS) agnostic.

In various embodiments, refresh commands may be inhibited to DRAM components which have received no write transactions after power-on. Refresh power of DRAM may depend on device capacities and may vary from 15% to 50% of active power. Inhibiting refresh commands as disclosed herein may advantageously offer aggressive power savings and, in turn, enhanced battery life.

The mechanisms and methods disclosed herein may be employed to reduce or minimize power consumption of a memory sub-system, which may improve battery life (e.g., an amount of time the device can function before a recharge). Implementation costs for these mechanisms and methods in hardware and/or firmware may be very minimal. Battery-powered and/or hand-held platforms may have severe constraints on thermal dissipation owing to their small form-factor designs. By reducing power consumed by a memory sub-system in an active state, the problems associated with thermal dissipation (such as performance degradation) may be reduced and/or circumvented. This may be especially significant for future platforms, which may employ higher-density DRAM technologies, or may integrate DRAM as part of a package using 3D technology. Reducing thermal dissipation as well as active power may advantageously help not only by extending battery life, but also by simplifying an overall platform architecture and design.

With respect to FIGS. 1 and 2 below, a platform (e.g., a mobile platform) may have four single-rank DIMMs. In each rank, individual DRAM devices/chips may be combined. One or more memory ranks may be combined to form a DIMM, which may occupy a DIMM slot in a platform.

FIG. 1 illustrates power states of a System-on-Chip (SoC) and individual Dual In-line Memory Modules (DIMMs) pertaining to an S0 state (e.g., an operational state), in accordance with some embodiments of the disclosure.

A first scenario 110 pertains to an SoC 112 and a plurality of memory ranks 114, labelled R0 through R3. In various embodiments, memory ranks R0 through R3 may be on DIMMs comprising a set of DRAM components (e.g., on DIMMs with one memory rank) and/or on DIMMs comprising more than one set of DRAM components (e.g., on DIMMs with more than one memory rank). In some embodiments, some of memory ranks R0 through R3 may on different memory channels. Memory rank R0 is in-use, and in an operational state, but memory ranks R1 through R3 are not in-use.

SoC 112 is in an operational state. The power states of memory ranks R0 through R3 in the operational state may be decided at a system-level and may be independent of in-use memory consumption (e.g., the amount of physical memory consumed by applications and an operating system (OS) at any given time, as may be reflected by a memory-performance tab of an OS task manager).

In first scenario 110, the power consumed by a memory sub-system during an operational state (assuming that in-use memory consumption is limited to a single memory rank) may be calculated as:

$$P_{OPERATIONAL}=(1\times\text{active-power})+(3\times\text{refresh-power})$$

A second scenario 120 pertains to an SoC 122 and a plurality of memory ranks 124, labelled R0 through R3 (which may be substantially similar in nature to memory ranks 114). Memory rank R0 is in-use, and in an operational state, but memory ranks R1 through R3 are not in-use.

SoC 122 is in an operational state. The power states of memory ranks R0 through R3 in the operational state may be based on whether a given memory rank is in-use or not in-use, with memory refreshes being inhibited for memory ranks that are not in-use. Here, memory ranks R1 through R3 are not in-use, and refreshes to these memory ranks are accordingly inhibited. (Memory rank R0 may be left in an operational state or in a self-refresh mode, based on an overall platform power state.)

In second scenario 120, the power consumed by the memory sub-system during operational state may be calculated as:

$$P_{OPERATIONAL}=(1\times\text{active-power})$$

Accordingly, in comparison with first 110 scenario, there may be a savings in power for an operational state of (3× refresh-power), since the refresh cycles to the memory ranks are inhibited.

Figure 2:
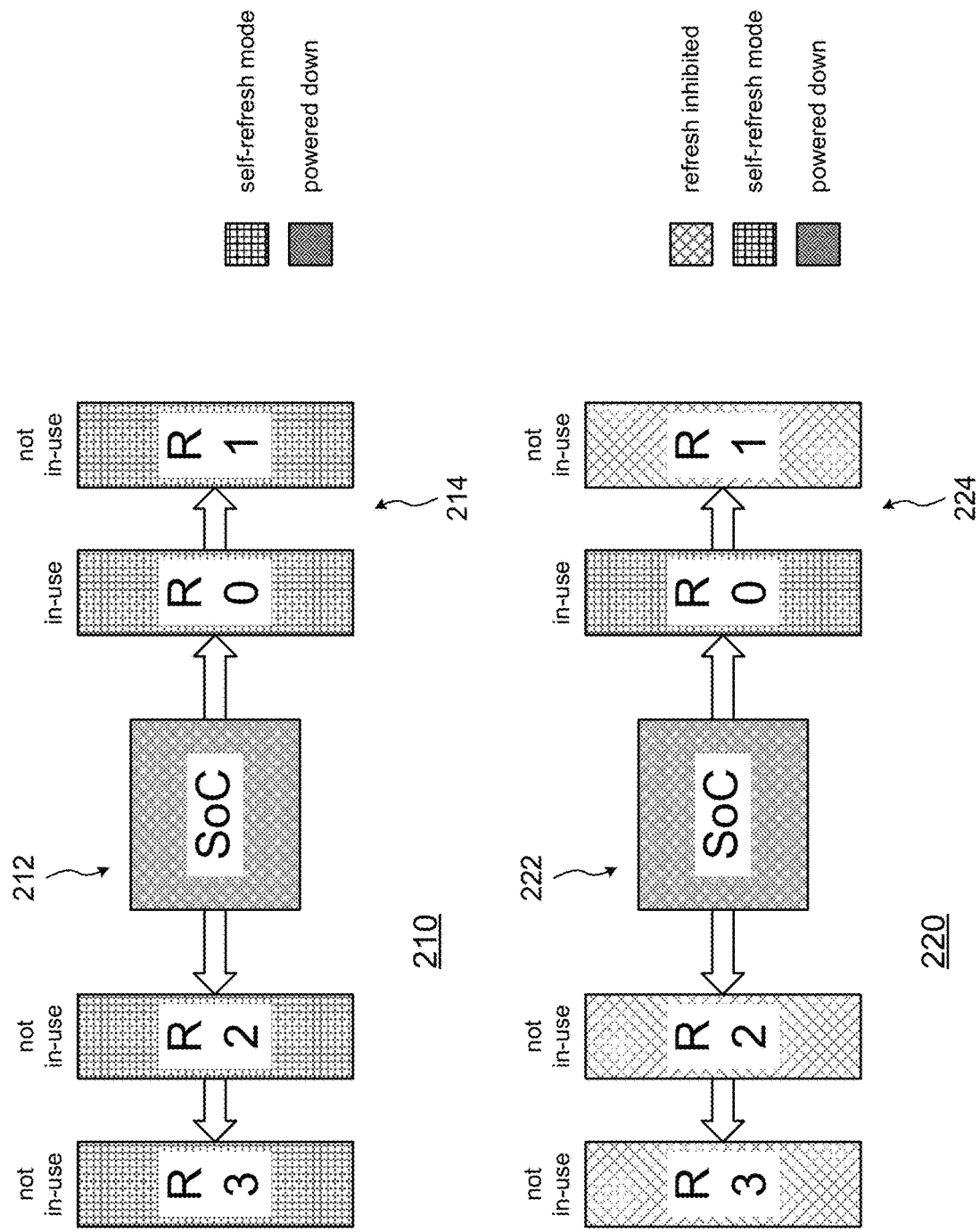
FIG. 2 illustrates power states of an SoC and individual DIMMs pertaining to sleep states such as an S3 state or an S0ix state (e.g., an active idle stand-by power state), in accordance with some embodiments of the disclosure.

FIG. 2 illustrates power states of an SoC and individual DIMMs pertaining to sleep states such as an S3 state or an S0ix state (e.g., an active idle stand-by power state), in accordance with some embodiments of the disclosure.

A first scenario 210 pertains to an SoC 212 and a plurality of memory ranks 214, labelled R0 through R3 (which may be substantially similar in nature to memory ranks 114). Memory rank R0 is in-use, but memory ranks R1 through R3 are not in-use.

SoC 212 is in a powered-down state. The power states of memory ranks R0 through R3 (e.g., DRAM memories) in sleep states may be decided at a system-level and may be independent of in-use memory consumption. Accordingly, here, memory ranks R0 through R3 are in a self-refresh mode.

In first scenario 210, the power consumed by a memory sub-system during a sleep state may be calculated as:

$$P_{SLEEP}=(4\times\text{refresh-power})$$

A second scenario 220 pertains to an SoC 222 and a plurality of memory ranks 224, labelled R0 through R3

(which may be substantially similar in nature to memory ranks 114). Memory rank R0 is in-use, but memory ranks R1 through R3 are not in-use.

SoC 222 is in a powered-down state. The power states of memory ranks R0 through R3 in sleep states may be based on whether a given memory rank is in-use or not in-use, with memory refreshes being inhibited for memory ranks that are not in-use. Here, memory ranks R1 through R3 are not in-use, and refreshes to these memory ranks are accordingly inhibited. (Memory rank R0 may be left in an operational state or in a self-refresh mode, based on an overall platform power state.)

In second scenario 220, the power consumed by a memory sub-system during a sleep state may be calculated as:

$$P_{SLEEP} = (1 \times \text{refresh-power})$$

Accordingly, in comparison with first scenario 210 there may be a savings in power for sleep states of (3× refresh-power), since the refresh cycles to the memory ranks are inhibited.

With respect to FIGS. 1 and 2, when in-use memory consumption is restricted to fewer than all memory ranks, power savings for the memory sub-system may be possible since refresh commands to the remaining memory ranks may be stopped. For example, in the best-case scenario, when in-use memory consumption is restricted to a single memory rank, maximum power savings for the memory sub-system may be possible since refresh commands to the other three memory ranks may be stopped. Alternatively, in the worst-case scenario, when in-use memory consumption spans all memory ranks (e.g., all memory ranks are kept in an active power state), it may merely be the case that no power savings may be possible for the memory sub-system.

Preliminary results based on estimates extrapolated from power measurements indicate that the mechanisms and methods disclosed herein may offer savings in power up to about 5% of total system power, or up to about 28% of the memory sub-system power consumption. These results are based on keeping in-use memory consumption to less than 50% (which allowed putting two out of four memory ranks in refresh-inhibited mode).

In actual measurements of power consumed by the memory sub-system, a customized system firmware was used to hold various memory ranks under reset, to simulate keeping in-use memory consumption to less than 50% and inhibiting refresh cycles those memory ranks. The actual power measurements from the platform for different conditions suggest that the mechanisms and methods disclosed herein may offer savings in power of up to about 21% of the memory sub-system power consumption, which matches closely with the preliminary results.

Larger-capacity DRAM devices in the future are forecasted as having an increased ration of refresh-power to active-power, with some estimates forecasting an increase of about 60%. Accordingly, with higher-capacity DRAM devices of the future, refresh power consumption may be more significant and less easy to ignore.

Figure 3A:
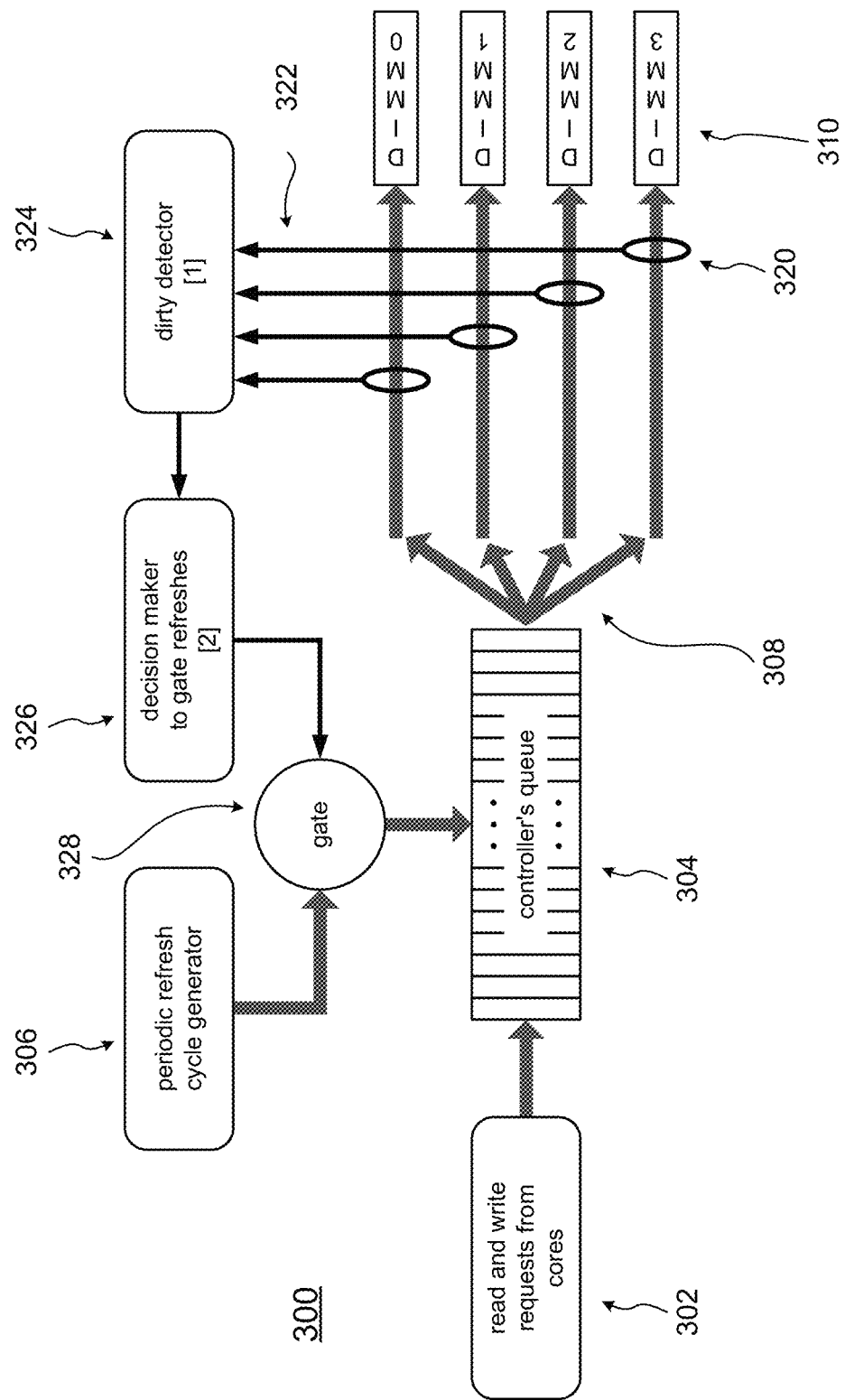
FIGS. 3A-3B illustrate high-level architecture diagrams of design for inhibiting memory refresh cycles to DIMMs not in use, in accordance with some embodiments of the disclosure.
Figure 3B:
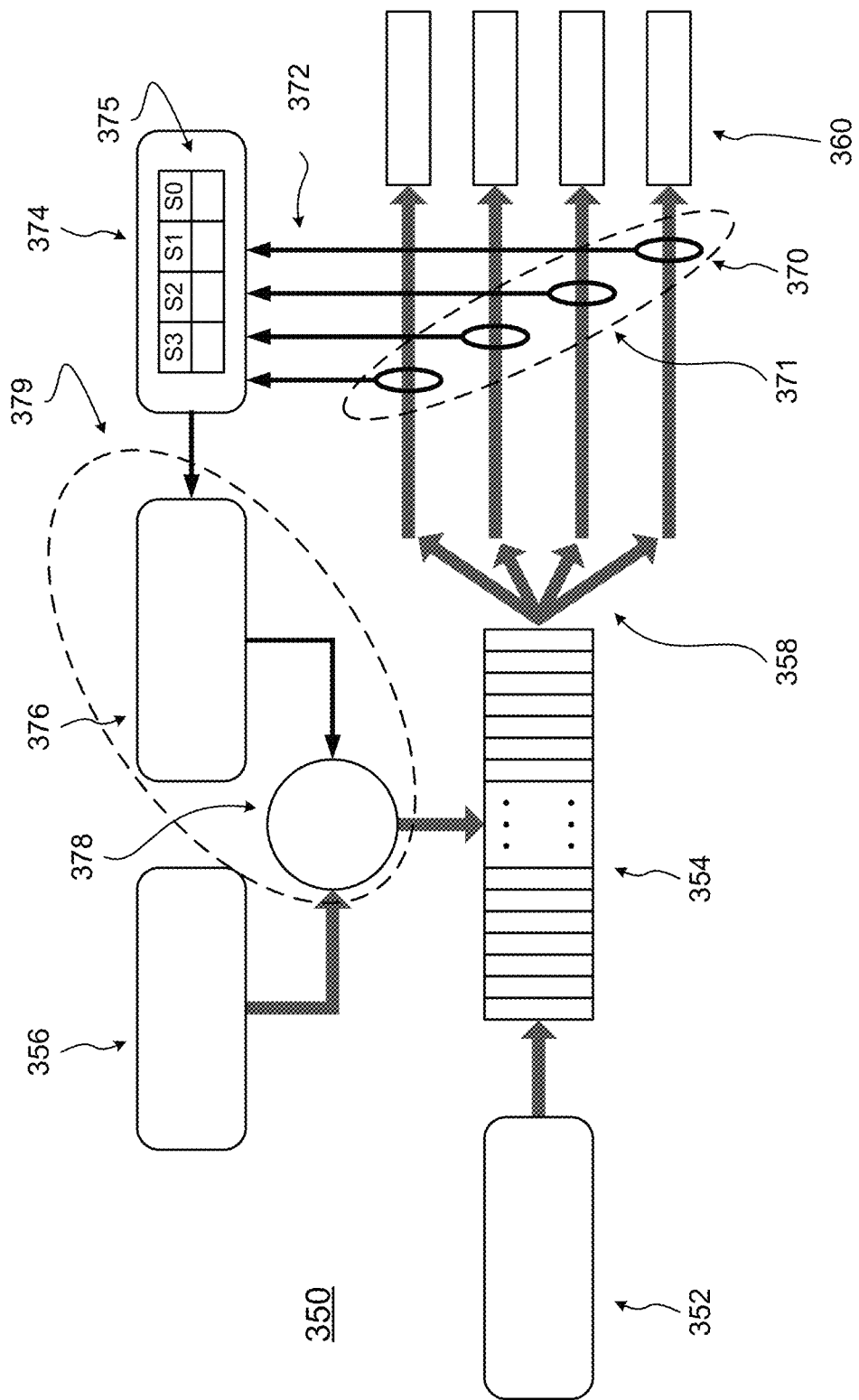

FIGS. 3A-3B illustrate high-level architecture diagrams of design for inhibiting memory refresh cycles to DIMMs not in use, in accordance with some embodiments of the disclosure. In FIG. 3A, a design 300 (which may include a portion of an MC design) may comprise a command interface 302, a queue circuitry 304, a refresh cycle generator circuitry 306, a memory interface 308, a plurality of memory ranks 310 (on separate DIMMs—although memory ranks of other embodiments may be on shared DIMMs—and on a shared channel or on a plurality of channels, as discussed herein), a plurality of snooping circuitries 320 respectively corresponding with the plurality of memory ranks 310, a dirty detector circuitry 324, a decision maker circuitry 326, and a gating circuitry 328.

A high-level architecture of the mechanisms disclosed herein may incorporate two functionalities. The first functionality may be accomplished by a circuitry in an MC to snoop memory traffic and store indicators of whether individual memory ranks are in-use (e.g., "dirty") or not. This information (e.g., "dirty bits") may be exposed to firmware through a register interface. The circuitry for this first functionality may be called a "dirty detector." The second functionality may be accomplished by circuitry in the MC to either gate or un-gate insertions of periodic refresh cycles to various memory ranks (e.g., refresh cycles for separate memory-ranks).

Accordingly, in various embodiments, command interface 302 of an MC may accept read and/or write commands targeting memory ranks 360 (e.g., from a processor) and may provide the commands to queue circuitry 304. Meanwhile, refresh cycle generator circuitry 306 may provide refresh cycle commands, separately for each memory rank, to queue circuitry 304 as well. Queue circuitry 304 may then provide the queued commands via memory interface 308 (which may comprise one or more channels) to memory ranks 310.

Meanwhile, snooping circuitries 320 may identify write commands targeting memory ranks 310 and may flag such identified commands to dirty detector circuitry 324, separately for each memory rank, via a plurality of indicators 322 respectively corresponding with memory ranks 310. Dirty detector circuitry 324 may comprise a plurality of dirty bits respectively corresponding with memory ranks 310 to store assertions of indicators 322.

Dirty detector circuitry 324 may then provide the stored indicators (e.g., the register bits) to decision maker circuitry 326. Based on the stored indicators corresponding with memory ranks 310, decision maker circuitry 326 may cause a gating circuitry 328 to either permit or deny the propagation of memory refresh cycles from refresh cycle generator circuitry 306 to queue circuitry 304, separately for each memory rank.

In FIG. 3B, a design 350 (which may include a portion of an MC design) may be substantially similar to design 300. Design 350 may comprise a command interface 352, a queue circuitry 354, a refresh cycle generator circuitry 356, a memory interface 358, a plurality of memory ranks 360 (on separate DIMMs and/or sharing DIMMs, and on a shared channel or on a plurality of channels, as discussed herein), a plurality of snooping circuitries 370 respectively corresponding with the plurality of memory ranks 360, a plurality of indicators 372 respectively corresponding with memory ranks 360, a dirty detector circuitry 374, a decision maker circuitry 376, and a gating circuitry 378.

In some embodiments, a snooping circuitry 371 may comprise one or more of the plurality of snooping circuitries 370. For some embodiments, dirty detector circuitry 374 may comprise a plurality of dirty bits 375 respectively corresponding with memory ranks 360 to store assertions of indicators 372. In some embodiments, a circuitry 379 may comprise portions of decision making circuitry 376 and gating circuitry 378.

In a variety of embodiments, an apparatus incorporating design 350 may comprise a first circuitry (e.g., dirty detector circuitry 374), a second circuitry (e.g., refresh cycle generator circuitry 356), and a third circuitry (e.g., circuitry 379). The first circuitry may be operable to set a stored value (e.g., a dirty bit 375) to a predetermined value upon a determination (e.g., from snooping circuitry 371) that a command provided to a memory interface (e.g., memory interface 358) is a command that targets a range of memory (e.g., a memory rank), the command being of a type for which memory refreshes are employed (e.g., a write command). The second circuitry may be operable to generate refresh cycles for the range of memory. The third circuitry may be operable to prevent the propagation of the refresh cycles to the targeted range of memory based upon the stored value.

In some embodiments, the range of memory may be contained within a DRAM DIMM. For some embodiments, the range of memory may be a rank of memory on the DRAM DIMM. In some embodiments, the command may be determined to be a write command that targets the range of memory based upon one or more command bits of the command and/or one or more chip-select bits of the command.

For some embodiments, the third circuitry may prevent the propagation of refresh cycles to the memory interface based upon the stored value. In some embodiments, the stored value may be set to an initialized value after removal and replacement of power to the range of memory. For some embodiments, the apparatus incorporating design 350 may comprise a fourth circuitry (e.g., queue circuitry 354) that may be operable to store a plurality of commands that target the memory interface. In some embodiments, the third circuitry may be operable to prevent the entry of the refresh cycles into the fourth circuitry.

For some embodiments, the first circuitry may be operable to set one of a plurality of stored values to a predetermined value upon a determination that a command provided to the memory interface is a write command that targets one of a plurality of ranges of memory that respectively correspond to the plurality of stored values. The second circuitry may be operable to generate refresh cycles for the plurality of ranges of memory. The third circuitry may be operable to prevent the propagation of the refresh cycles from the second circuitry to the targeted range of memory based upon value of the plurality of stored values that corresponds with the targeted range of memory.

For some embodiments, the memory ranges may be separate ranges of memory within a memory rank. In some embodiments, the ranges of memory may comprise non-DRAM memory technologies (e.g., nonvolatile memories) and/or memory technologies not implemented in ranks of memory. For some embodiments, the removal and/or replacement of power may include situations in which there is a sudden loss of power (followed by power being restored), and situations in which systems enter and/or exit low-power states (e.g., suspend-to-RAM, suspend-to-disk, and so forth).

Alternatively, in a variety of embodiments, an apparatus incorporating design 350 may comprise an interface (e.g., memory interface 358) to one or more ranges of memory (e.g., memory ranks), a first circuitry (e.g., snooping circuitry 371), a second circuitry (e.g., dirty detector circuitry 374), and a third circuitry (e.g., circuitry 379). The first circuitry may be operable to provide one or more indicators (e.g., indicators 372) that respectively correspond with the one or more ranges of memory, to detect when a command provided to the interface is a command that targets one of the ranges of memory (e.g., a memory rank), and to assert the indicator that corresponds with the targeted range of memory based on the detection, the command being of a type for which memory refreshes are employed (e.g., a write command). The second circuitry may be operable to store one more values that respectively correspond with the one or more ranges of memory, and to record assertions of the one or more indicators (e.g., in dirty bits 375). The third circuitry may be operable to prevent the propagation of refresh cycles to the one or more ranges of memory based upon the one or more values of the second circuitry that correspond with the one or more ranges of memories.

In some embodiments, the one or more ranges of memory may be contained within one or more DRAM DIMMs. For some embodiments, the one or more ranges of memory may be one or more ranks of memory on the DRAM DIMMs. In some embodiments, the first circuitry may be operable to detect when the command provided to the interface is a write command that targets one of the ranges of memory based upon one or more command bits of the command and/or one or more chip-select bits of the command. For some embodiments, the one or more values of the second circuitry may be set to initialized values after removal and replacement of power to the range of memory.

In some embodiments, the apparatus incorporating design 350 may comprise a refresh cycle circuitry (e.g., refresh cycle generator circuitry 356) which may be operable to generate refresh cycles for the one or more ranges of memory. For some embodiments, the apparatus incorporating design 350 may comprise an interface queue circuitry (e.g., queue circuitry 354) which may include at least one queue operable to store commands that target the memory interface. In some embodiments, the third circuitry may be operable to prevent the refresh cycles from being entered into the interface queue circuitry.

For some embodiments, the memory ranges may be separate ranges of memory within a memory rank. In some embodiments, the ranges of memory may comprise non-DRAM memory technologies (e.g., nonvolatile memories) and/or memory technologies not implemented in ranks of memory. For some embodiments, the removal and/or replacement of power may include situations in which there is a sudden loss of power (followed by power being restored), and situations in which systems enter and/or exit low-power states (e.g., suspend-to-RAM, suspend-to-disk, and so forth).

Figure 4:
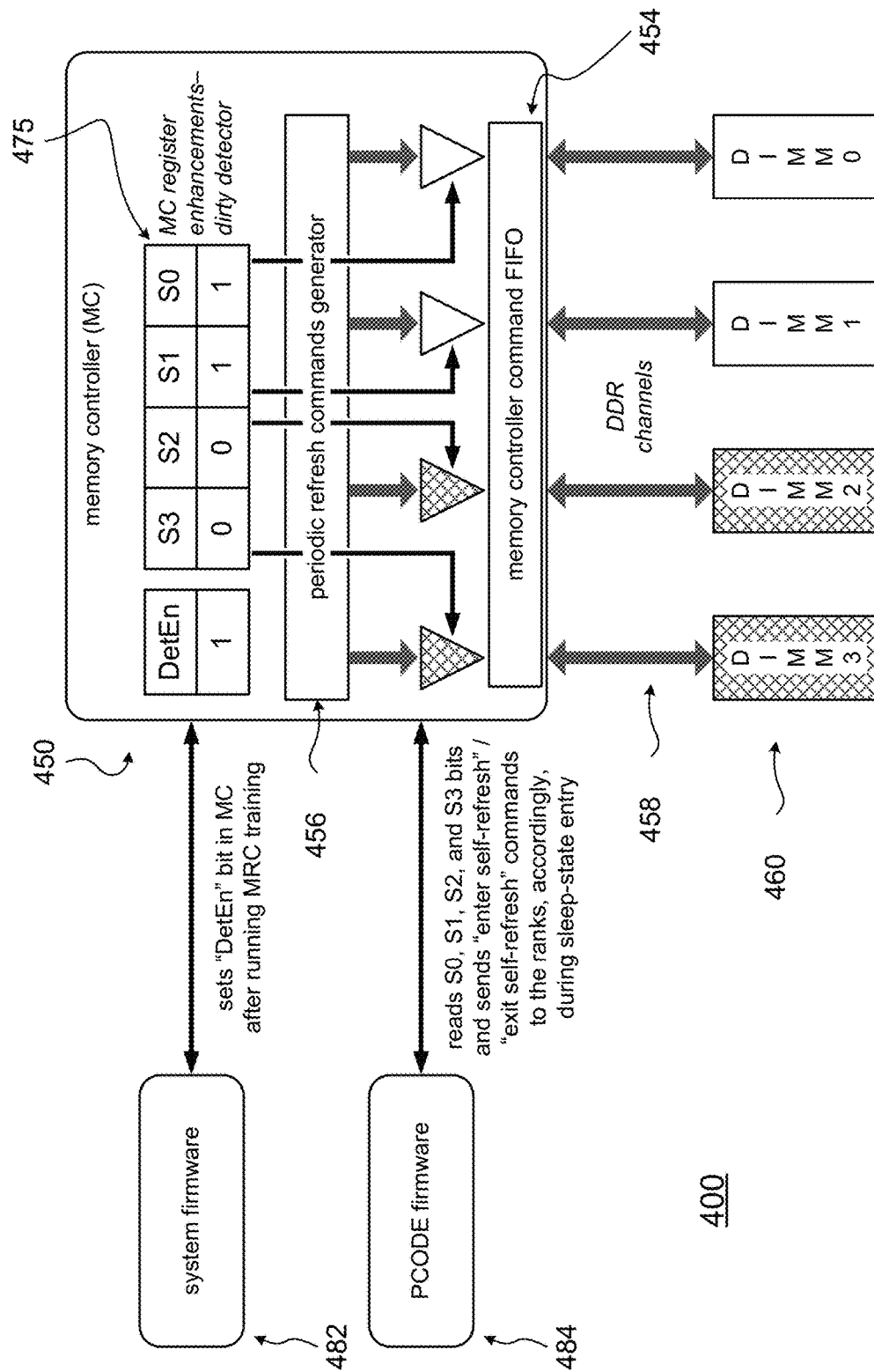
FIG. 4 illustrates an implementation level block diagram of a design for inhibiting memory refresh cycles to DIMMs not in use, in accordance with some embodiments of the disclosure.

FIG. 4 illustrates an implementation level block diagram of a design for inhibiting memory refresh cycles to DIMMs not in use, in accordance with some embodiments of the disclosure. A design 400 may comprise an MC 450, a plurality of memory ranks 460 on separate DIMMs—although memory ranks of other embodiments may be on shared DIMMs—and on a shared channel or on a plurality of channels, as discussed herein), a system firmware 482, and a PCODE firmware 484. MC 450 may in turn comprise a queue circuitry 454, a refresh cycle generator circuitry 456, a memory interface 458, and a plurality of dirty bits 475 respectively corresponding with memory ranks 460.

Various embodiments of the mechanisms disclosed herein may comprise three components: an MC (such as MC 450), a system firmware (such as system firmware 482), and a PCODE firmware, e.g., firmware executing on a P-UNIT (such as PCODE firmware 484).

The MC may be enhanced to perform two tasks as follows. The first task to be performed by the MC is to track write transactions flowing toward the memory ranks (e.g., toward DIMMs)—which may be termed "downstream memory traffic"—using a dirty detector. In the dirty detector, to inform the MC to start tracking the downstream memory traffic, a single bit (depicted as register bit "DetEn") may be provided per MC instance. The power-on default of this register bit may be a first value (e.g., a binary value of "0"). In addition, a single dirty bit register bit may be provided per memory rank (e.g., dirty bits, depicted as register bits "S0," "S1," "S2," and "S3" for the four single-rank DIMMs), which may be set by the MC when any write transaction targeting that memory rank flows from the MC to that memory rank. These register bit fields (the global MC-level bit and the rank-level bits) may be mapped to a register space accessible to the system firmware and/or the PCODE firmware.

The second task to be performed by the MC is to provide one control bit per memory rank which may gate and un-gate periodic refresh cycles inserted by the MC targeting each memory rank. These control bits may be driven by the S0, S1, S2, and S3 bits of the dirty detector.

With respect to the system firmware, during the system firmware boot, the main memory may be brought up by a memory reference code (MRC), e.g., by executing training algorithms. Then, after the memory is brought-up and mapped to the system memory, enhancements to the system firmware may set the "DetEn" bit to start tracking write transactions flowing downstream.

The PCODE firmware may be enhanced to read the "S0," "S1," "S2," and "S3" register bit fields. Based on these register bit fields, and a sleep state transition (e.g., sleep state entry and/or sleep state exit), the PCODE firmware may command the MC to issue "enter self-refresh" commands and/or "exit self-refresh" commands to the individual memory ranks.

Figure 5A:
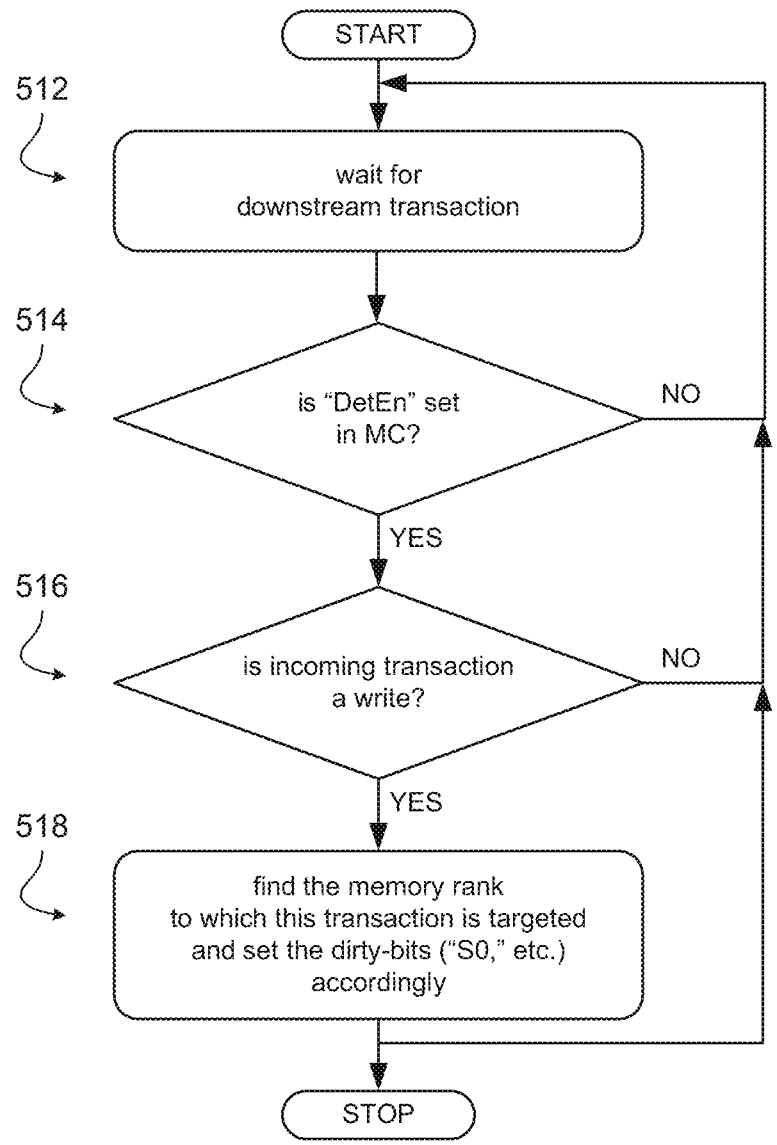
FIGS. 5A-5B illustrate flow diagrams for memory controller (MC) enhancements for inhibiting memory refresh cycles to DIMMs not in use, in accordance with some embodiments of the disclosure.
Figure 5B:
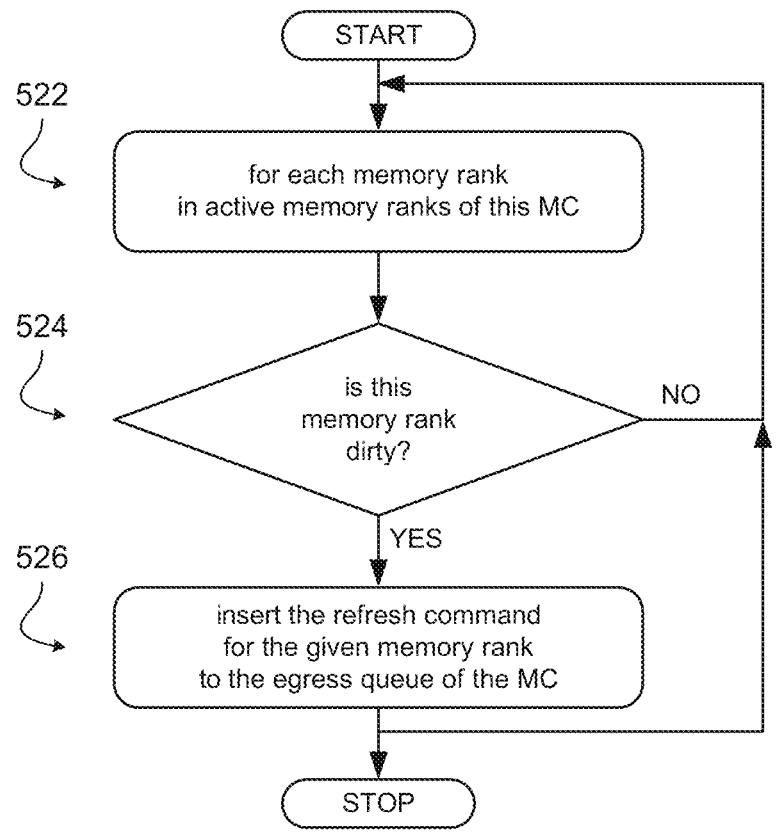

FIGS. 5A-5B illustrate flow diagrams for MC enhancements for inhibiting memory refresh cycles to DIMMs not in use, in accordance with some embodiments of the disclosure. FIG. 5A pertains to MC enhancements related to dirty detection. A flow 510 may have various parts. Upon starting, in a first part 512, flow 510 may wait for a downstream transaction. Then, in a second part 514, flow 510 may determine whether a "DetEn" bit is set in an MC. If not, then flow 510 may return to first part 512.

If the "DetEn" bit is set in the MC, then in a third part 516, flow 510 may determine whether an incoming transaction is a write transaction. If not, then flow 510 may return to first part 512.

If the incoming transaction is a write transaction, then in a fourth part 518, flow 510 may find a memory rank to which the write transaction is targeted, then set the corresponding dirty bit.

FIG. 5B pertains to MC enhancements related to refresh generation. A flow 520 may have various parts. Upon starting, in a first part 522, flow 520 may iterate through each memory rank of active (e.g., available) memory ranks of an MC.

Then, in a second part 524, flow 520 may determine whether the memory rank is dirty (e.g., whether it is in use and/or has been targeted by write commands). If not, then flow 520 may return to first part 522 (e.g., to iterate to the next memory rank). If the memory rank is dirty, then in a third part 526, flow 520 may insert refresh commands for the memory rank from entering the egress queue of the MC, and return to first part 522.

Figure 6A:
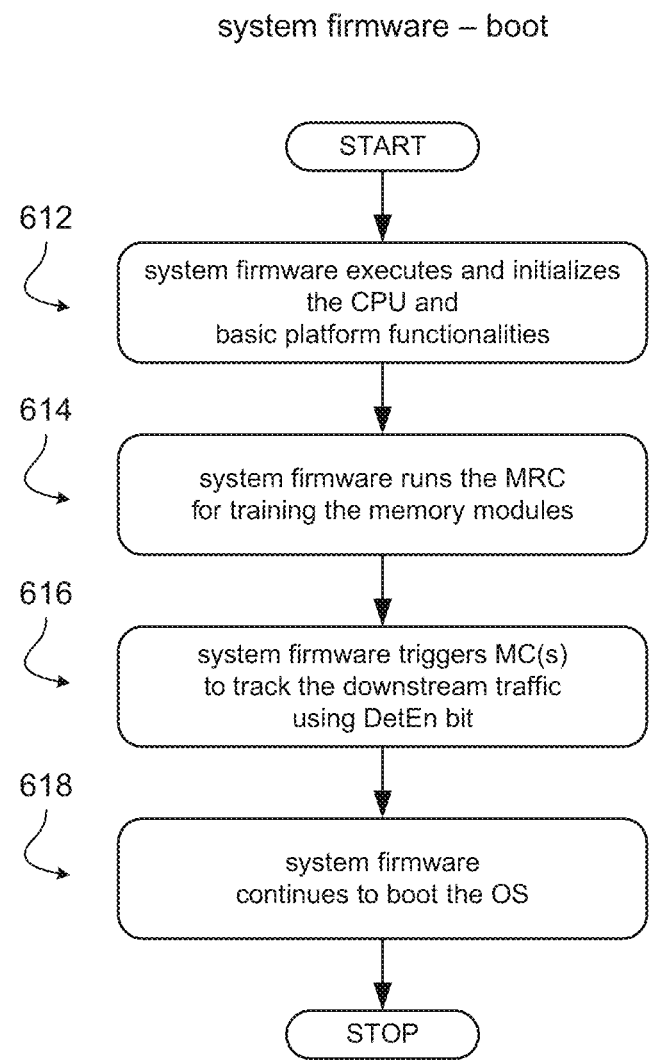
FIGS. 6A-6C illustrate flow diagrams for firmware during various power transitions to inhibit memory refresh cycles to DIMMs not in use, in accordance with some embodiments of the disclosure.
Figure 6B:
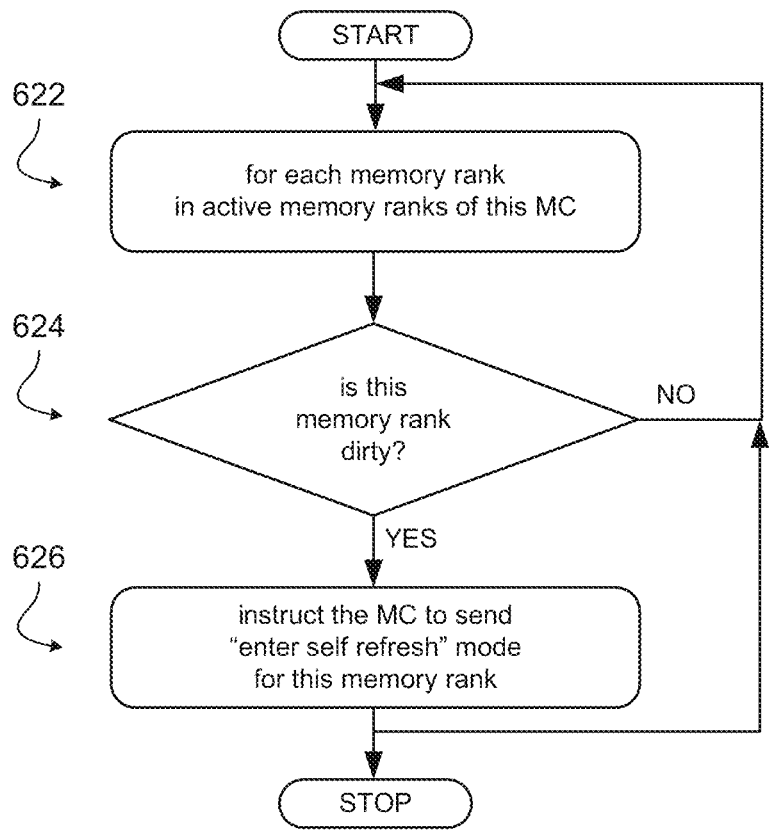
Figure 6C:
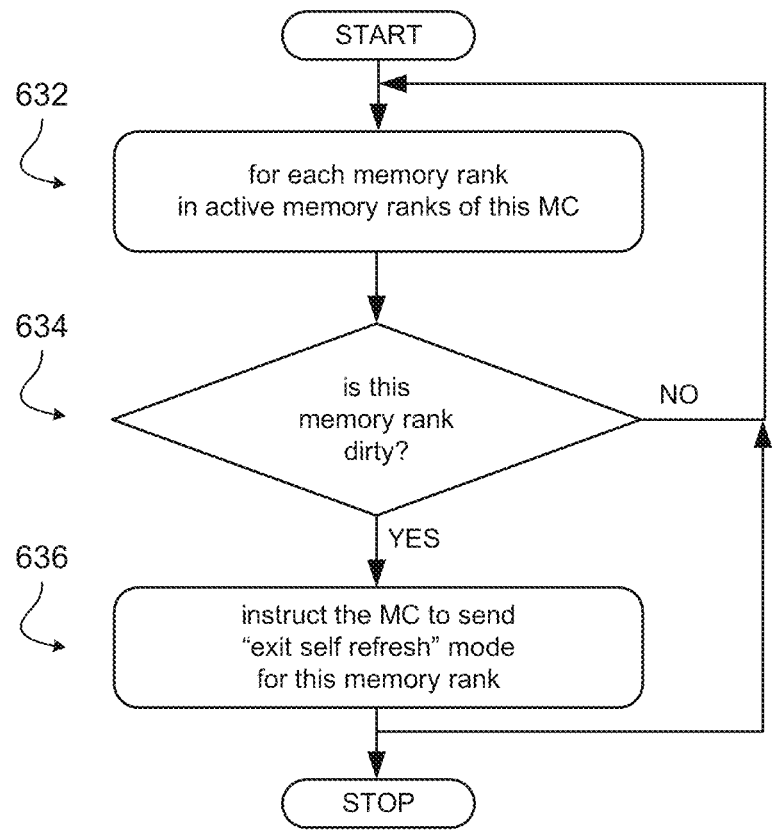

FIGS. 6A-6C illustrate flow diagrams for firmware during various power transitions to inhibit memory refresh cycles to DIMMs not in use, in accordance with some embodiments of the disclosure. In various embodiments, some methods for firmware may be applicable to system boot and/or entry to or exit from different low-power states (such as sleep states, hibernate states, and so on). FIG. 6A pertains to system boot. A flow 610 may have various parts.

Upon starting, in a first part 612, system firmware may execute and/or initialize a CPU, and/or perform basic platform functionalities. Then, in a second part 614, system firmware may run an MRC for training memory modules (which may comprise various memory ranks). Then, in a third part 616, system firmware may trigger one or more MCs to track downstream traffic based upon a "DetEn" bit. Then, in fourth part 618, system firmware may continue to boot an OS.

FIG. 6B pertains to sleep state entry. A flow 620 may have various parts. Upon starting, in a first part 622, flow 620 may iterate through each memory rank of active (e.g., available) memory ranks of an MC.

Then, in a second part 624, flow 620 may determine whether the memory rank is dirty (e.g., whether it is in use and/or has been targeted by write commands). If not, then flow 620 may return to first part 622 (e.g., to iterate to the next memory rank). If the memory rank is dirty, then in a third part 626, flow 620 may instruct the MC to send "enter self refresh" mode for this memory rank (e.g., as a command), and return to first part 622.

FIG. 6C pertains to sleep state exit. A flow 630 may have various parts. Upon starting, in a first part 632, flow 630 may iterate through each memory rank of active (e.g., available) memory ranks of an MC.

Then, in a second part 634, flow 630 may determine whether the memory rank is dirty (e.g., whether it is in use and/or has been targeted by write commands). If not, then flow 630 may return to first part 632 (e.g., to iterate to the next memory rank). If the memory rank is dirty, then in a third part 636, flow 630 may instruct the MC to send "exit self refresh" mode for this memory rank (e.g., as a command), and return to first part 632.

Figure 7:
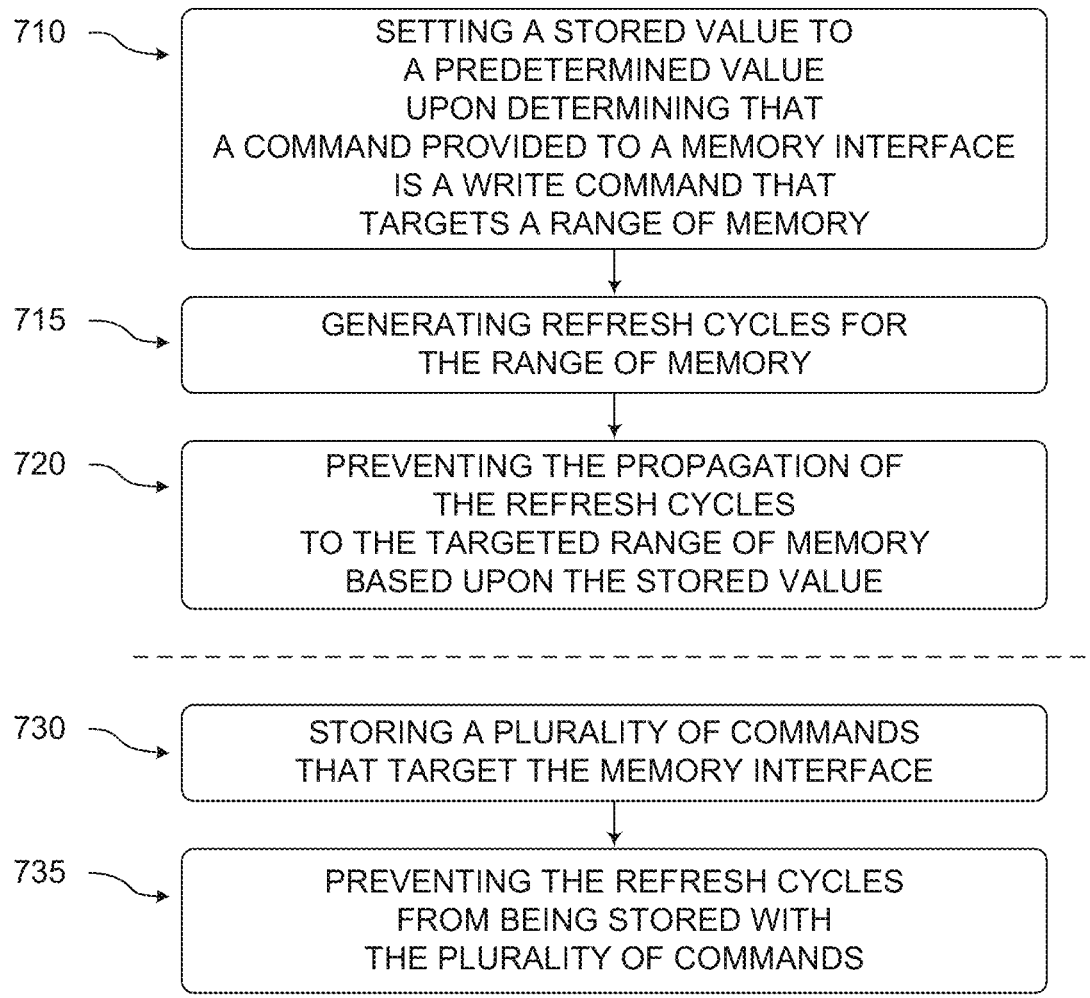
FIG. 7 illustrates methods for reducing power consumed by memory ranks by inhibiting refresh commands to memory ranks that are not in-use, in accordance with some embodiments.

FIG. 7 illustrates methods for reducing power consumed by memory ranks by inhibiting refresh commands to memory ranks that are not in-use, in accordance with some embodiments. A method 700 may comprise a setting 710, a generating 715, and a preventing 720. In various embodiments, method 700 may also comprise a storing 730 and a preventing 735.

In setting 710, a stored value may be set to a predetermined value upon determining that a command provided to a memory interface is a command that targets a range of memory (e.g., a memory rank), the command being of a type for which memory refreshes are employed (e.g., a write command). In generating 715, refresh cycles for the range of memory may be generated. In preventing 720, the propagation of the refresh cycles to the targeted range of memory may be prevented based upon the stored value.

In some embodiments, the range of memory may be contained within a DRAM DIMM. For some embodiments, the range of memory may be a rank of memory on the DRAM DIMM. In some embodiments, the command may be determined to be a write command that targets the range of memory based upon one or more command bits of the command and/or one or more chip-select bits of the command.

For some embodiments, in storing 730, a plurality of commands that target the range of memory may be stored, and in preventing 735, the refresh cycles may be prevented from being stored with the plurality of commands.

In some embodiments, the prevention of the propagation of the refresh cycles to the memory interface may be based upon the stored value. For some embodiments, the stored value may be set to an initialized value after removal and replacement of power to the range of memory.

Although the actions in the flowcharts with reference to FIGS. 5A-5B, FIGS. 6A-6C, and FIG. 7 are shown in a particular order, the order of the actions can be modified. Thus, the illustrated embodiments can be performed in a different order, and some actions may be performed in parallel. Some of the actions and/or operations listed in FIGS. 5A-5B, FIGS. 6A-6C, and FIG. 7 are optional in accordance with certain embodiments. The numbering of the actions presented is for the sake of clarity and is not intended to prescribe an order of operations in which the various actions must occur. Additionally, operations from the various flows may be utilized in a variety of combinations.

In some embodiments, an apparatus may comprise means for performing various actions and/or operations of the methods of FIGS. 5A-5B, FIGS. 6A-6C, and FIG. 7.

Moreover, in some embodiments, machine readable storage media may have executable instructions that, when executed, cause one or more processors to perform an operation comprising a method of FIGS. 5A-5B, FIGS. 6A-6C, and FIG. 7. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Figure 8:
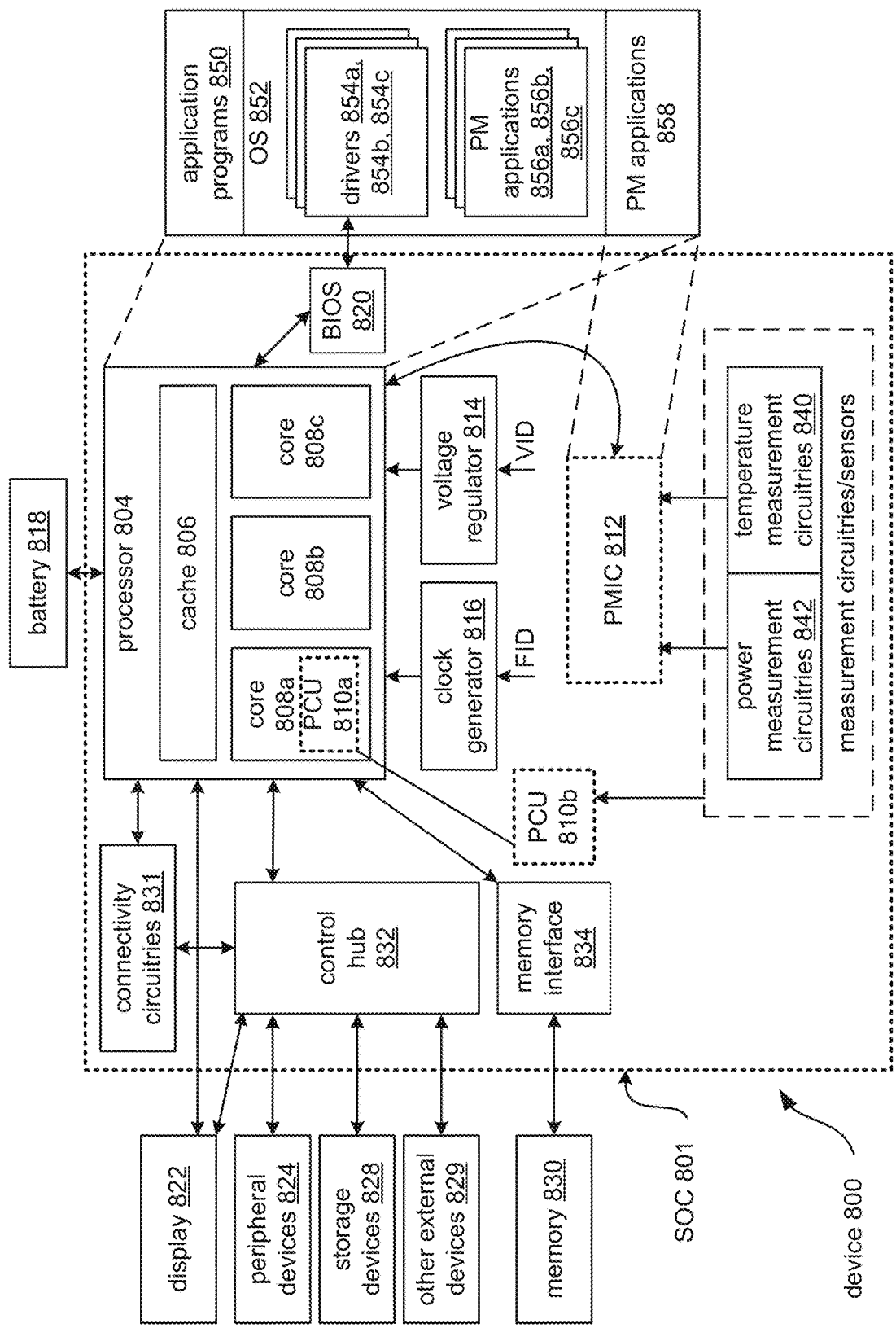
FIG. 8 illustrates a computer system or computing device with mechanisms for reducing power consumed by memory ranks by inhibiting refresh commands to memory ranks that are not in-use, in accordance with some embodiments.

FIG. 8 illustrates a computer system or computing device with mechanisms for reducing power consumed by memory ranks by inhibiting refresh commands to memory ranks that are not in-use, in accordance with some embodiments. It is pointed out that those elements of FIG. 8 having the same reference numbers (or names) as the elements of any other figure may operate or function in any manner similar to that described, but are not limited to such.

In some embodiments, a device 800 may comprise an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 800.

In some embodiments, device 800 may comprise a System-on-Chip (SoC) 801. An example boundary of SoC 801 is depicted using dotted lines in FIG. 8, with some example components depicted as being included within SoC 801. However, SoC 801 may include any appropriate components of device 800.

In some embodiments, device 800 may comprise a processor 804. Processor 804 may include one or more physical devices, such as microprocessors, application processors, microcontrollers, programmable logic devices, processing cores, or other processing means. The processing operations performed by processor 804 may include the execution of an operating system or an operating platform on which applications and/or device functions are, in turn, executed. The processing operations may include operations related to I/O (input/output) either with a human user or with other devices, operations related to power management, operations related to connecting computing device 800 to another device, and/or the like. The processing operations may also include operations related to audio I/O and/or display I/O.

In some embodiments, processor 804 may comprise multiple processing cores 808a, 808b, and 808c (also referred to as cores). Although three cores 808a, 808b, and 808c are depicted in FIG. 8, processor 804 may include any appropriate number of cores, e.g., tens of cores or even hundreds of cores. Cores 808a, 808b, and/or 808c may be implemented on a single integrated circuit (IC) chip. Moreover, the chip may include one or more shared and/or private caches, buses or interconnections, graphics and/or memory controllers, and/or other components. In various embodiments, a memory controller on the chip may include mechanisms for reducing power consumed by memory ranks by inhibiting refresh commands to memory ranks that are not in-use, as disclosed herein.

In some embodiments, processor 804 may comprise a cache 806. In some embodiments, sections of cache 806 may be dedicated to individual cores (e.g., a first section of cache 806 may be dedicated to core 808a, a second section of cache 806 may be dedicated to core 808b, and so on). For some embodiments, one or more sections of cache 806 may be shared among two or more of the cores. Cache 806 may be split into different levels, e.g., a level 1 (L1) cache, a level 2 (L2) cache, a level 3 (L3) cache, and so on.

In some embodiments, cores 808a, 808b, and/or 808c may include a fetch unit to fetch instructions (including instructions with conditional branches) for execution by the core. The instructions may be fetched from a memory 830 (which may comprise any of a variety of storage devices). Cores 808a, 808b, and/or 808c may also include a decode unit to decode the fetched instruction. For some embodiments, the decode unit may decode fetched instruction into a plurality of micro-operations. Cores 808a, 808b, and/or 808c may also include a schedule unit to perform various operations associated with storing decoded instructions. In some embodiments, the schedule unit may hold data from the decode unit until the instructions are ready for dispatch, e.g., until all source values of a decoded instruction become available. For some embodiments, the schedule unit may schedule and/or issue (or dispatch) decoded instructions to an execution unit for execution.

The execution unit may execute dispatched instructions after they are decoded (e.g., by the decode unit) and dispatched (e.g., by the schedule unit). In some embodiments, the execution unit may include more than one type of execution unit (such as an imaging computational unit, a graphics computational unit, a general-purpose computational unit, and so on). The execution unit may also perform various arithmetic operations such as addition, subtraction, multiplication, and/or division, and may include one or more arithmetic logic units (ALUs). For some embodiments, a co-processor (not shown) may perform various arithmetic operations in conjunction with the execution unit.

Furthermore, the execution unit may execute instructions out-of-order. Accordingly, in some embodiments, cores 808a, 808b, and/or 808c may comprise an out-of-order processor core. Cores 808a, 808b, and/or 808c may also include a retirement unit. The retirement unit may retire executed instructions after they are committed. For some embodiments, retirement of the executed instructions may result in processor state being committed from the execution of the instructions, physical registers used by the instructions being de-allocated, and so on. Cores 808a, 808b, and/or 808c may also include a bus unit to enable communication between components of the core and other components via one or more buses. Cores 808a, 808b, and/or 808c may additionally include one or more registers to store data accessed by various components of the core (such as values related to assigned app priorities and/or sub-system states (modes) association.

In some embodiments, device 800 may comprise one or more connectivity circuitries 831, which may include hardware devices (e.g., wireless and/or wired connectors and communication hardware) and/or software components (e.g., drivers, protocol stacks, and so on) to enable device 800 to communicate with external devices. Device 800 may be separate from the external devices, such as other computing devices, wireless access points or base stations, and so on.

In some embodiments, connectivity circuitries 831 may include circuitries directed toward multiple different types of connectivity (e.g., connectivity protocols). To generalize, connectivity circuitries 831 may include cellular connectivity circuitries, wireless connectivity circuitries, and so on. Cellular connectivity circuitries of connectivity circuitries 831 may refer generally to cellular network connectivity provided by wireless carriers, such as via GSM (global system for mobile communications) or variations or derivatives thereof, via CDMA (code division multiple access) or variations or derivatives thereof, via TDM (time division multiplexing) or variations or derivatives thereof, via 3rd Generation Partnership Project (3GPP) Universal Mobile Telecommunications Systems (UMTS) system or variations or derivatives thereof, via 3GPP Long-Term Evolution (LTE) system or variations or derivatives thereof, via 3GPP LTE-Advanced (LTE-A) system or variations or derivatives thereof, via Fifth Generation (5G) wireless system or variations or derivatives thereof, via 5G mobile networks system or variations or derivatives thereof, via 5G New Radio (NR) system or variations or derivatives thereof, or via other cellular service standards.

Wireless connectivity circuitries (or wireless interfaces) of connectivity circuitries 831 may refer generally to wireless connectivity that is not cellular, and may include personal area networks (such as Bluetooth, Near Field, and so on), local area networks (such as Wi-Fi), wide area networks (such as WiMax), and/or other wireless communication. For some embodiments, connectivity circuitries 831 may include a network interface, such as a wired or wireless interface, so that a system embodiment may be incorporated into a wireless device (for example, into a cell phone or a personal digital assistant).

In some embodiments, device 800 may comprise a control hub 832, which may represent hardware devices and/or software components related to interaction with one or more I/O devices. Control hub 832 may be a chipset, a Platform Control Hub (PCH), and/or the like. Via control hub 832, processor 804 may communicate with a display 822 (or one or more displays), one or more peripheral devices 824, one or more storage devices 828, one or more other external devices 829, and so on.

Control hub 832 may provide one or more connection points for additional devices that connect to device 800, through which a user might interact with the system. In some embodiments, devices that can be attached to device 800 (e.g., external devices 829) may include microphone devices, speaker or stereo systems, audio devices, video systems or other display devices, keyboard or keypad devices, and/or other I/O devices for use with specific applications such as card readers or other devices.

As mentioned above, control hub 832 can interact with audio devices, display 822, and so on. In some embodiments, input through a microphone or other audio device may provide input or commands for one or more applications or functions of device 800. Additionally, audio output may be provided instead of, or in addition to display output. For some embodiments, if display 822 includes a touch screen, display 822 may also act as an input device, which may be at least partially managed by control hub 832. There may also be additional buttons or switches on computing device 800 to provide I/O functions managed by control hub 832. In some embodiments, control hub 832 may manage devices such as accelerometers, cameras, light sensors or other environmental sensors, or other hardware that can be included in device 800. The input may be part of direct user interaction, and may also provide environmental input to the system to influence its operations (such as filtering for noise, adjusting displays for brightness detection, applying a flash for a camera, or other features).

In some embodiments, control hub 832 may couple to various devices using any appropriate communication protocol, e.g., PCIe (Peripheral Component Interconnect Express), USB (Universal Serial Bus), Thunderbolt, High Definition Multimedia Interface (HDMI), Firewire, and so on.

In some embodiments, display 822 may represent hardware components (e.g., display devices) and software components (e.g., drivers) that provide a visual and/or tactile display for a user to interact with device 800. Display 822 may include a display interface, a display screen, and/or hardware device used to provide a display to a user. In some embodiments, display 822 may include a touch screen (or touch pad) device that provides both output and input to a user. In some embodiments, display 822 may communicate directly with processor 804. Display 822 may be an internal display device (e.g., as in a mobile electronic device or a laptop device) or an external display device attached via a display interface (e.g., DisplayPort, and so on). For some embodiments, display 822 may be a head mounted display (HMD) such as a stereoscopic display device for use in virtual reality (VR) applications or augmented reality (AR) applications.

In some embodiments, in addition to (or instead of) processor 804, device 800 may include a Graphics Processing Unit (GPU) (not depicted in the figure). The GPU may comprise one or more graphics processing cores, which may control one or more aspects of displaying contents on display 822.

For some embodiments, control hub 832 may include hardware interfaces and connectors, as well as software components (e.g., drivers, protocol stacks, and so on) to make peripheral connections, e.g., to peripheral devices 824.

It will be understood that device 800 could both be a peripheral device to other computing devices, as well as have peripheral devices connected to it. Device 800 may have a "docking" connector to connect to other computing devices for purposes such as managing content (e.g., downloading and/or uploading, changing, and/or synchronizing content) on device 800. Additionally, a docking connector may allow device 800 to connect to certain peripherals that allow computing device 800 to control content output (e.g., to audiovisual systems and/or other systems).

In addition to a proprietary docking connector or other proprietary connection hardware, device 800 may make peripheral connections via common or standards-based connectors. Such connectors may include a Universal Serial Bus (USB) connector (which may include any of a number of different hardware interfaces), a DisplayPort connector or MiniDisplayPort (MDP) connector, a High Definition Multimedia Interface (HDMI) connector, a Firewire connector, or other types of connectors.

In some embodiments, connectivity circuitries 831 may be coupled to control hub 832, e.g., in addition to, or instead of, being coupled directly to processor 804. In some embodiments, display 822 may be coupled to control hub 832, e.g., in addition to, or instead of, being coupled directly to processor 804.

In some embodiments, device 800 may comprise memory 830, which may be coupled to processor 804 via a memory interface 834. Memory 830 may include memory devices for storing information in device 800. Memory devices may include nonvolatile memory devices (for which state might not change if power to the memory device is interrupted) and/or volatile memory devices (for which state may be indeterminate, or lost, if power to the memory device is interrupted). Memory 830 may comprise a dynamic random access memory (DRAM) device, a static random access memory (SRAM) device, a flash memory device, a phase-change memory device, or another memory device (e.g., a memory device having performance suitable for serving as process memory). In some embodiments, memory 830 may operate as system memory for device 800, to store data and instructions for use when the one or more processors (e.g., processor 804) executes an application or process. Memory 830 may store application data, user data, music, photos, documents, or other data, as well as system data (whether long-term or temporary) related to the execution of the applications and functions of device 800.

Elements of various embodiments and examples may also be provided as a machine-readable medium (e.g., memory 830) for storing the computer-executable instructions (e.g., instructions to implement any other processes discussed herein). The machine-readable medium (e.g., memory 830) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. Some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, one or more measurement circuitries and/or sensors of device 800 may comprise temperature measurement circuitries 840, e.g., for measuring temperature of various components of device 800. In some embodiments, temperature measurement circuitries 840 may be embedded, or coupled or attached to various components, whose temperature are to be measured and monitored. For some embodiments, temperature measurement circuitries 840 may measure temperatures of (or within) one or more of cores 808a, 808b, 808c, a voltage regulator 814, memory 830, a mother-board of SoC 801, and/or any other appropriate component of device 800.

In some embodiments, the measurement circuitries and/or sensors of device 800 may comprise one or more power measurement circuitries 842, e.g., for measuring power consumed by one or more components of the device 800. For some embodiments, power measurement circuitries 842 may measure power, voltage, and/or current. In some embodiments, power measurement circuitries 842 may be embedded, coupled, or attached to various components whose power, voltage, and/or current consumption are to be measured and monitored. For some embodiments, power measurement circuitries 842 may measure: power, voltage, and/or current supplied by voltage regulator 814 (which may comprise one or more voltage regulator); power supplied to SoC 801; power supplied to device 800; power consumed by processor 804 (or any other component) of device 800; and so on.

In some embodiments, device 800 may comprise one or more voltage regulator circuitries in voltage regulator 814. Voltage regulator 814 may generate signals at appropriate voltage levels, which may be supplied to operate any appropriate components of the device 800. As an example, voltage regulator 814 is depicted as supplying one or more signals (e.g., voltage signals) to processor 804 of device 800. In some embodiments, voltage regulator 814 may receive one or more Voltage Identification (VID) signals, and generates the voltage signals (e.g., to processor 804) at appropriate levels, based on the VID signals. Various type of VRs may be utilized for voltage regulator 814. In some embodiments, voltage regulator 814 may include a "buck" voltage regulator, a "boost" voltage regulator, a combination of buck and boost voltage regulators, low dropout (LDO) regulators, switching DC-DC regulators, and so on. Buck voltage regulators may be used in power delivery applications in which an input voltage is transformed to an output voltage in a ratio that is smaller than unity. Boost voltage regulators may be used in power delivery applications in which an input voltage is transformed to an output voltage in a ratio that is larger than unity. In some embodiments, each processor core may have its own voltage regulator, which may be controlled by a Power Control Unit (PCU) 810a, a PCU 810b, and/or a Power Management Integrated Circuit (PMIC) 812. In some embodiments, each core may have a network of distributed LDOs to provide efficient control for power management. The LDOs may be digital, analog, or a combination of digital or analog LDOs.

In some embodiments, device 800 may comprise one or more clock generator circuitries in a clock generator 816. Clock generator 816 generates clock signals at appropriate frequency levels, which may be supplied to any appropriate components of device 800. As an example, clock generator 816 is depicted as supplying clock signals to processor 804 of device 800. In some embodiments, clock generator 816 may receive one or more Frequency Identification (FID) signals, and may generate the clock signals at an appropriate frequency, based on the FID signals.

In some embodiments, device 800 may comprise a battery 818 supplying power to various components of device 800. As an example, battery 818 is depicted as supplying power to processor 804. Although not depicted in the figures, device 800 may comprise a charging circuitry, e.g., to recharge the battery based on an Alternating Current (AC) power supply received from an AC adapter.

In some embodiments, device 800 may comprise PCU 810a and/or PCU 810b (which may also be referred to as Power Management Units (PMUs), Power Controllers, and so on). In some embodiments, PCU 810a may be implemented by one or more of cores 808a, 808b, and/or 808c, as is symbolically depicted using a dotted box labelled PCU 810a. For some embodiments, PCU 810b may be implemented outside the cores, as is symbolically depicted using a dotted box labelled PCU 810b. PCU 810a and/or PCU 810b may implement various power management operations for device 800. PCU 810a and/or PCU 810b may include hardware interfaces, hardware circuitries, connectors, registers, and so on, as well as software components (e.g., drivers, protocol stacks), to implement various power management operations for device 800.

In some embodiments, device 800 may comprise PMIC 812, e.g., to implement various power management operations for device 800. In some embodiments, PMIC 812 may be a Reconfigurable Power Management ICs (RPMICs) and/or an IMVP (Intel® Mobile Voltage Positioning). In some embodiments, the PMIC may be within an IC chip separate from processor 804. The may implement various power management operations for device 800. PMIC 812 may include hardware interfaces, hardware circuitries, connectors, registers, and so on, as well as software components (e.g., drivers, protocol stacks), to implement various power management operations for device 800.

For some embodiments, device 800 may comprise PCU 810a, PCU 810b, and/or PMIC 812. In some embodiments, any one of PCU 810a, PCU 810b, and/or PMIC 812 may be absent in device 800, and hence, these components are depicted using dotted lines.

Various power management operations of device 800 may be performed by PCU 810a, PCU 810b, PMIC 812, or by a combination thereof. For some embodiments, PCU 810a, PCU 810b, and/or PMIC 812 may select a power state (e.g., a P-state) for various components of device 800. In some embodiments, PCU 810a, PCU 810b, and/or PMIC 812 may select a power state for various components of device 800 (e.g., in accordance with the ACPI (Advanced Configuration and Power Interface) specification). In some embodiments, for example, PCU 810a, PCU 810b, and/or PMIC 812 may cause various components of the device 800 to transition to a sleep state, to an active state, to an appropriate C state (e.g., C0 state, or another appropriate C state, in accordance with the ACPI specification), and so on.

For some embodiments, PCU 810a, PCU 810b, and/or PMIC 812 may control a voltage output by voltage regulator 814 and/or a frequency of a clock signal output by the clock generator, e.g., by outputting the VID signals and/or the FID signals, respectively. In some embodiments, PCU 810a, PCU 810b, and/or PMIC 812 may control battery power usage, charging of battery 818, and features related to power saving operation.

Clock generator 816 may comprise a phase locked loop (PLL), frequency locked loop (FLL), or any suitable clock source. In some embodiments, each core of processor 804 may have its own clock source. As such, each core may operate at a frequency independent of the frequency of operation of the other core. In some embodiments, PCU 810a, PCU 810b, and/or PMIC 812 may perform adaptive or dynamic frequency scaling or adjustment. For some embodiments, clock frequency of a processor core may be increased if the core is not operating at its maximum power consumption threshold or limit. In some embodiments, PCU 810a, PCU 810b, and/or PMIC 812 may determine the operating condition of each core of a processor, and may opportunistically adjust frequency and/or power supply voltage of that core without the core clocking source (e.g., a PLL of that core) losing lock when PCU 810a, PCU 810b, and/or PMIC 812 determines that the core is operating below a target performance level. In some embodiments, if a core is drawing current from a power supply rail less than a total current that is allocated for that core (or for processor 804), then PCU 810a, PCU 810b, and/or PMIC 812 may temporality increase the power draw for that core (or for processor 804), for example, by increasing a clock frequency and/or a power supply voltage level, so that the core or processor 804 can perform at a higher performance level. As such, in various embodiments, voltage and/or frequency may be increased temporality for processor 804 without violating product reliability.

For some embodiments, PCU 810a, PCU 810b, and/or PMIC 812 may perform power management operations, e.g., based at least in part on receiving measurements from power measurement circuitries 842, temperature measurement circuitries 840, charge level of battery 818, and/or any other appropriate information that may be used for power management. To that end, PMIC 812 may be communicatively coupled to one or more sensors to sense and/or detect various values of and/or variations in one or more factors having an effect on power and/or thermal behavior of the system or platform. Examples of the one or more factors may include electrical current, voltage droop, temperature, operating frequency, operating voltage, power consumption, inter-core communication activity, and so on. Sensors for one or more of these factors may be provided in physical proximity to (and/or in thermal contact with or thermally coupled to) one or more components or logic/IP blocks of a computing system (e.g., a computing system of device 800). Additionally, in some embodiments, sensor(s) may be directly coupled to PCU 810a, PCU 810b, and/or PMIC 812 to allow PCU 810a, PCU 810b, and/or PMIC 812 to manage processor core energy at least in part based on value(s) detected by one or more of the sensors.

Also depicted is an example software stack of device 800 (although not all elements of the software stack are depicted). In various embodiments, processor 804 may execute application programs 850, Operating System (OS) 852, one or more Power Management (PM) specific application programs (e.g., generically referred to as PM applications 858), and/or the like. PM applications 858 may also be executed by PCU 810a, PCU 810b, and/or PMIC 812. OS 852 may also include one or more PM applications 856a, 856b, 856c, and so on. OS 852 may also include various drivers 854a, 854b, 854c, and so on, some of which may be specific for power management purposes. In some embodiments, device 800 may further comprise a Basic Input/Output System (BIOS) 820. BIOS 820 may communicate with OS 852 (e.g., via one or more of drivers 854a, 854b, 854c, and so on), communicate with processor 804, and so on.

In various embodiments, one or more of PM applications 858, drivers that OS 852 includes (e.g., drivers 854a, 854b, 854c, and so on), PM applications that OS 852 includes (e.g., PM applications 856a, 856b, 856c, and so on), BIOS 820, and so on may be used to implement power management specific tasks. For example, these components may be used to control voltage and/or frequency of various components of device 800, to control wake-up state, sleep state, and/or any other appropriate power state of various components of device 800, to control battery power usage, to control a charging of the battery 818, to control features related to power saving operation, and so on.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a processor; and
a memory controller coupled to the processor, wherein the memory controller is to:
identify a command provided to a memory interface;
set, based on an identification that the command targets a first range of memory and an identification that the command is of a type for which memory refreshes are employed, a stored value of a register to a predetermined value;
determine, based on the stored value of the register being the predetermined value, that the first range of memory is to remain active; and
allow, based on the stored value of the register being the predetermined value, the first range of memory to refresh.

2. The apparatus of claim 1, wherein the memory controller is to allow propagation of a refresh cycle to allow the first range of memory to refresh.

3. The apparatus of claim 1, wherein the memory controller is further to prevent, if the stored value of the register is not the predetermined value, propagation of a refresh cycle to inhibit the first range of memory to refresh.

4. The apparatus of claim 1, wherein the first range is within a Dynamic Random Access Memory (DRAM) Dual In-Line Memory Module (DIMM).

5. The apparatus of claim 4, wherein the first range is a rank of memory on the DRAM DIMM.

6. The apparatus of claim 1 comprising the memory interface to be communicatively coupled to the memory, wherein the memory controller is to allow the first range of memory to refresh.

7. The apparatus of claim 1, wherein the command is a write command.

8. The apparatus of claim 1, wherein the stored value is set to an initialized value after removal and replacement of power to the first range of the memory.

9. A machine-readable storage media having one or more machine-readable instructions stored thereon that, when executed, cause one or more machines to perform a method comprising:
identifying a command provided to a memory interface;
setting, based on an identification that the command targets a first range of memory and an identification that the command is of a type for which memory refreshes are employed, a stored value of a register to a predetermined value;
determining, based on the stored value of the register being the predetermined value, that the first range of memory that is to remain active; and
allowing, based on the stored value of the register being the predetermined value, the first range of memory to refresh.

10. The machine-readable storage media of claim 9, wherein the command is a write command.

11. The machine-readable storage media of claim 9, wherein setting the stored value includes changing the stored value from an initialized value that is based on removing and replacing of power to the first range of the memory.

12. The machine-readable storage media of claim 9, wherein the first range is within a Dynamic Random Access Memory (DRAM) Dual In-Line Memory Module (DIMM).

13. The machine-readable storage media of claim 12, wherein the first range is a rank of memory on the DRAM DIMM.

14. A system comprising:
a processor;
a memory controller coupled to the processor;
a Dynamic Random Access Memory (DRAM) Dual In-Line Memory Module (DIMM) coupled to the memory controller via a memory interface;
a wireless interface to allow the processor to communicate with another device, wherein the memory controller is to:
identify a command provided to the memory interface;
set, based on an identification that the command targets a first range of memory and an identification that the command is of a type for which memory refreshes are employed, a stored value of a register to a predetermined value;
determine, based on the stored value of the register being the predetermined value, that the first range of memory is to remain active; and
allow, based on the stored value of the register being the predetermined value, the first range of memory to refresh, wherein the first range is a rank of memory on the DRAM DIMM.

15. The system of claim 14, wherein the command is a write command.

16. The system of claim 14, wherein the memory controller is to allow propagation of a refresh cycle to allow the first range of memory to refresh.

17. The system of claim 14, wherein the memory controller is further to prevent, if the stored value of the register is not the predetermined value, propagation of a refresh cycle to inhibit the first range of memory to refresh.

18. The system of claim 14, wherein the stored value is set to an initialized value after removal and replacement of power to the first range of the memory.

\* \* \* \* \*